(12) United States Patent  (10) Patent No.: US 8,780,257 B2
Gidon  (45) Date of Patent: Jul. 15, 2014

(54) IMAGER DEVICE FOR EVALUATING DISTANCES OF ELEMENTS IN AN IMAGE

(75) Inventor: Pierre Gidon, Echirolles (FR)

(73) Assignee: Commissariat à l'énergie atmoque et aux énergies alternatives, Paris (FR)

( * ) Notice: Subject to any disclaimer, the term of this patent is extended or adjusted under 35 U.S.C. 154(b) by 0 days.

(21) Appl. No.: 13/443,474

(22) Filed: Apr. 10, 2012

(65) Prior Publication Data

US 2012/0274834 A1    Nov. 1, 2012

(30) Foreign Application Priority Data

Apr. 28, 2011 (FR) ...................... 11 53643

(51) Int. Cl.
    G03B 13/00    (2006.01)
    H04N 3/14     (2006.01)
    H04N 5/225    (2006.01)
    G02B 27/10    (2006.01)

(52) U.S. Cl.
    USPC ........... 348/345; 359/619; 359/626; 348/273; 348/274; 348/275; 348/207

(58) Field of Classification Search
    USPC ....................................................... 348/345
    See application file for complete search history.

(56) References Cited

U.S. PATENT DOCUMENTS

| 5,359,383 | A | 10/1994 | Miida et al. | |
| 5,592,223 | A | 1/1997 | Takamura et al. | |
| 7,307,788 | B2 * | 12/2007 | Boettiger et al. | 359/619 |
| 7,560,679 | B1 | 7/2009 | Gutierrez | |
| 8,400,555 | B1 * | 3/2013 | Georgiev et al. | 348/345 |
| 2006/0027239 | A1 | 2/2006 | Wang | |
| 2006/0145077 | A1 * | 7/2006 | Kim | 250/339.02 |
| 2007/0014019 | A1 | 1/2007 | Mouli | |
| 2009/0261439 | A1 | 10/2009 | Liu et al. | |

(Continued)

FOREIGN PATENT DOCUMENTS

| EP | 0 833 502 A2 | 4/1998 |
| EP | 2 299 491 A2 | 3/2011 |
| WO | WO 02/49366 A1 | 6/2002 |

OTHER PUBLICATIONS

Preliminary Search Report issued Sep. 16, 2011 in French Patent Application No. FR 1153643, FA 752441 (with English translation of Category of Cited Documents).

(Continued)

*Primary Examiner* — Twyler Haskins
*Assistant Examiner* — Padma Haliyur
(74) *Attorney, Agent, or Firm* — Oblon, Spivak, McClelland, Maier & Neustadt, L.L.P.

(57) ABSTRACT

An imager device including:
   an imager integrated circuit comprising a matrix of pixels,
   several first, second and third focusing means such that each focusing means is provided facing a group of four associated pixels forming a 2×2 matrix, and is capable of focusing light rays to the group of associated pixels, and perform focusing which are different and equivalent to an arrangement of groups of associated pixels at three distances which are different toward the inlet face for light rays in the imager device,
   fourth means capable of passing, with respect to each group of pixels, the light rays directed toward said group and passing through the focusing means associated with said group, and capable of blocking the light rays directed toward said group and passing through the other focusing means.

24 Claims, 8 Drawing Sheets

(56) References Cited

U.S. PATENT DOCUMENTS

2010/0091146 A1 4/2010 Rodriguez Ramos et al.
2011/0063416 A1 3/2011 Getin et al.
2012/0050562 A1* 3/2012 Perwass et al. ............ 348/222.1

OTHER PUBLICATIONS

Ben C. Platt, et al., "History and Principles of Shack-Hartmann Wavefront Sensing", Journal of Refractive Surgery, vol. 17, Sep./Oct. 2001, pp. S573-S577.

* cited by examiner

IMAGER DEVICE FOR EVALUATING DISTANCES OF ELEMENTS IN AN IMAGE

TECHNICAL FIELD

The invention relates to the field of image capture from which it is possible to determine distances between observed objects or elements and the location of image shooting. In such images, called depth maps, the brightness and/or colour represented are for example a function of this distance. The invention relates in particular to an imager device performing such an image capture, also called Z camera.

STATE OF PRIOR ART

In the field of depth map capture, imager devices are said to be active or passive depending on whether or not they resort to a light source supplementary to the incident light received by the device and coming from the scene.

In the case of passive imager devices, the depth map is generally extracted and constructed from images acquired with conventional imager integrated circuits, that is imager integrated circuits capable of performing a capture of standard images. The depth maps are obtained by performing complex calculations from several images successively captured or taken side by side.

A passive imager device is for example used in autofocus systems of reflex type cameras. This kind of imager device is complex and integrates a high number of photodetectors as well as an optical system at each measurement point. The most efficient systems detect up to a thousand measurement points and determine their optics defocusing values. From this information, it is possible to determine the distance of an object, but not to obtain a depth map.

A so-called "Plenoptic" camera can also be used to obtain a depth map. Once again, the structure of this camera is complex and high in pixel consumption.

DESCRIPTION OF THE INVENTION

Thus there is a need to provide a new imager device which is capable of performing a depth map capture, that is capable of delivering information enabling a distance between one or more elements of the captured scene and the imager device to be readily determined, neither requiring additional light source nor particular optical system, and which does not require, at an equivalent resolution, a high number of pixels with respect to a conventional imager device.

To do this, one embodiment provides an imager device including at least:
 one imager integrated circuit comprising a matrix of pixels for receiving light rays from a scene,
 several first, second and third focusing means provided side by side on the matrix of pixels, between the matrix of pixels and an inlet face for the light rays in the imager device, such that each of said focusing means is provided facing a group of at least four said pixels associated with said focusing means and forming a 2×2 matrix, and is capable of focusing part of the light rays to said group of associated pixels, the focusing performed by the first, second and third focusing means being different from one another,
 fourth means capable of passing, with respect to each group of pixels, the light rays directed towards said group of pixels and passing through the focusing means associated with said group of pixels, and capable of blocking the light rays directed towards said group of pixels and passing through the other focusing means.

The focusing performed by the first, second and third focusing means can be different from one another and equivalent to an arrangement of group of pixels associated with three different distances towards the inlet face for the light rays in the imager device.

The device is passive in that it does not require a further light source other than the incident light to obtain the information relating to the distance to be calculated.

The imager device does not actively intervene on the optical system, as for example systems with successive tests in search of the best contrast between several images by variation in the focusing position of an optics. The imager device enables a snap image capture to be performed from which can be directly obtained, from electric signals delivered by pixels, depth information relating to elements present on the image.

The imager device resorts to a conventional matrix of pixels and can thus be made from a traditional imager integrated circuit. In the imager device, on the imager integrated circuit are added focusing means changing the information captured by the pixels such that the signals delivered by the pixels can be used to extract other information than the usual light intensity at each point of the captured image. The three different focusing performed by the first, second and third focusing means can in particular be equivalent to three different focuses towards groups of associated pixels, that is an effect equivalent to an arrangement of groups of pixels at three distances different towards the inlet face of light rays in the imager device (this "simulated" distance is the same for the at least 4 pixels being part of a same group of pixels). In particular, it is possible to determine easily the position and orientation of contours of elements in the captured image, which then enables distances of these contours to be determined in a wide range of values. This range can depend on the focal length of an optical system used in the imager device to converge light rays coming from the scene towards the matrix of pixels. This imager device thus has a field angle and a field depth enabling the determination of coordinates X, Y and Z of elements of the scene which is captured.

Finally, no movement of the imager device neither nor further light source are required to the invention.

It is also provided an imager device including at least:
 an imager integrated circuit comprising a matrix of pixels for receiving light rays from a scene,
 several first, second and third portions of at least one optically transparent material, with non-zero thicknesses $e_1$, $e_2$ and $e_3$ respectively and such that $e_1 > e_2 > e_3$, provided side by side between the matrix of pixels and an inlet face for the light rays in the imager device, such that each of said portions of optically transparent material covers at least partly a group of at least four of said pixels associated with said portion of optically transparent material forming a 2×2 matrix,
 means capable of passing, with respect to each said group of pixels, the light rays directed towards said group of pixels and passing through the portion of optically transparent material covering said group of pixels, and capable of blocking the light rays directed towards said group of pixels and passing through the other portions of optically transparent material,
the refractive index of the optically transparent material being different from the refractive index of at least one material and/or gas present between the inlet face for the light rays and said means.

Each of said first, second and third focusing means may include a first, a second and a third portion respectively of at least one optically transparent material, with non-zero thicknesses $e_1$, $e_2$ and $e_3$ and such that $e_1 > e_2 > e_3$, and wherein the refractive index of the optically transparent material is different from the refractive index of at least one material and/or gas present between the inlet face for the light rays and the focusing means.

In this case, for each of the portions of optically transparent material, at least two of the portions of adjacent optically transparent material may include thicknesses which are different from that of said portion of optically transparent material.

It is also possible that for each of the portions of optically transparent material, all the adjacent portions of optically transparent material may include thicknesses different from that of said portion of optically transparent material.

The fourth means may include at least one opaque layer covering the portions of optically transparent material and through which passes a plurality of apertures each forming, with respect to each of said group of pixels, a diaphragm.

Each aperture may include, in a plane parallel to the inlet face for the light rays in the imager device, a substantially circular section and/or wherein the centre of each aperture may be spaced apart from the centre of an neighbouring aperture by a distance higher than about twice a dimension (for example the dimension of a side or diameter) of a pixel and/or wherein each aperture may have dimensions lower than those of one of said groups of four pixels (dimension of a side or diameter of said group of four pixels) and/or wherein each aperture may be substantially centred facing a boundary between two adjacent pixels.

The imager device may further include an optical system capable of guiding the light rays from the scene to the matrix of pixels. Such an optical system may correspond to a more or less complex optics, for example a single lens, enabling the light rays captured by the imager device to be converged towards the focusing means provided on the matrix of pixels. The convergence performed by the optical system may determine the captured depth range, wherein this depth range may be adjusted by adjusting the convergence performed by the optical system when the optical centre seen by the imager device is fixed.

Each aperture may be centred with respect to a straight line going through the optical centre of the optical system and the centre of the group of pixels the aperture of which forms a diaphragm.

In another alternative, the fourth means may include a first matrix of colour filters provided between the matrix of pixels and the portions of optically transparent material, and a second matrix of colour filters covering the portions of optically transparent material, each filter of the first matrix covering one of said group of pixels and each filter of the second matrix covering one of said portions of optically transparent material, the light absorption spectra of two substantially superimposed colour filters of the first and the second matrix being substantially similar.

The first and/or second matrix of colour filters may include first, second, third and fourth colour filters comprising different light absorption spectra.

At least one part of the portions of optically transparent material may include an inlet surface for the light rays forming a concave or convex dioptre. Lenses can thus be made, their contours being sufficiently different from the curvature of the incident wave to prevent reflection from being cancelled, such a cancellation occurring when the light rays arrive perpendicular to their inlet surface.

Each of the first, second and third focusing means may include a first, second and third lens, or microlens, respectively, having different convergences.

In this case, the fourth means may include portions of opaque material which are provided between the lenses.

The imager device may further include at least one layer of optically transparent material provided between the matrix of pixels and the lenses.

The first or second or third lenses may correspond to portions of spheres the centres of which substantially correspond to the centres of groups of pixels associated with said lenses.

The fourth means may include a matrix of optical filters provided between the matrix of pixels and the lenses, each optical filter of the matrix covering one of said groups of pixels, the light absorption spectra of two adjacent optical filters being different.

The fourth means may include:
first optical filters the light absorption spectra of which cut off the wavelengths in the visible region and pass at least part of the wavelengths of the infrared and/or ultraviolet region, each first optical filter being provided between a lens and the group of pixels associated with said lens,
second optical filters the light absorption spectra of which pass part of the wavelengths of the visible region and cut off the wavelengths of the infrared or ultraviolet region,
the first and second optical filters being alternately provided within a same matrix of optical filters which is provided between the matrix of pixels and the lenses.

The first optical filters may be provided such that they form a Bayer matrix.

The imager device may further include an optical system capable of guiding the light rays from the scene to the matrix of pixels.

Each lens may be centred with respect to a straight line going through the optical centre of the optical system and the centre of the group of pixels associated with said lens.

The optical system may be coupled to at least one mirror comprising at least one hole such that a first part of the light rays are reflected to said imager integrated circuit by the parts of the mirror which are peripheral to the hole and a second part of the light rays are guided to another imager integrated circuit through the hole.

The focusing means may be arranged in a staggered row with respect to each other.

In one alternative, focusing means may be provided as such a matrix such that each group of five aligned focusing means includes at least one of each of the first, second and third focusing means.

Thus, such a distribution may form a pseudo-random paving enabling a substantially uniform distribution of the different convergences performed by the different focusing means on the whole matrix of pixels.

Electric interconnection lines electrically connected to photodetectors of the pixels may be provided at the periphery of said group of pixels.

The imager device may further include calculating means capable of calculating, from electric signals delivered by the pixels, a distance between the imager device and at least one element of the scene.

A method for making an imager device is also provided, including at least the steps of:
making an imager integrated circuit comprising a matrix of pixels for receiving the light rays from a scene,
making several first, second and third focusing means provided side by side on the matrix of pixels, between the matrix of pixels and an inlet face for the light rays in the imager device, such that each of said focusing means is provided facing at least one group of at least four of said pixels associated with said focusing means and forming a 2×2 matrix, and is capable of focusing part of the light rays towards said group of associated pixels, the focusing performed by the first, second and third focusing means being different from one another, making fourth means capable of passing, with respect to each group of pixels, the light rays directed towards said group of pixels and passing through the focusing means associated with said group of pixels, and capable of blocking the light rays directed towards said group of pixels and passing through the other focusing means.

BRIEF DESCRIPTION OF THE DRAWINGS

The present invention will be better understood upon reading the description of exemplary embodiments only given by way of illustration and in no way limiting and referring to the appended drawings wherein.

Different part represented in the figures are not necessarily drawn to a uniform scale, to provide better readability for the figures.

The different possibilities (alternatives and embodiments) should be understood as being not exclusive from each other and can be combined together.

DETAILED DESCRIPTION OF PARTICULAR EMBODIMENTS

Figure 1:
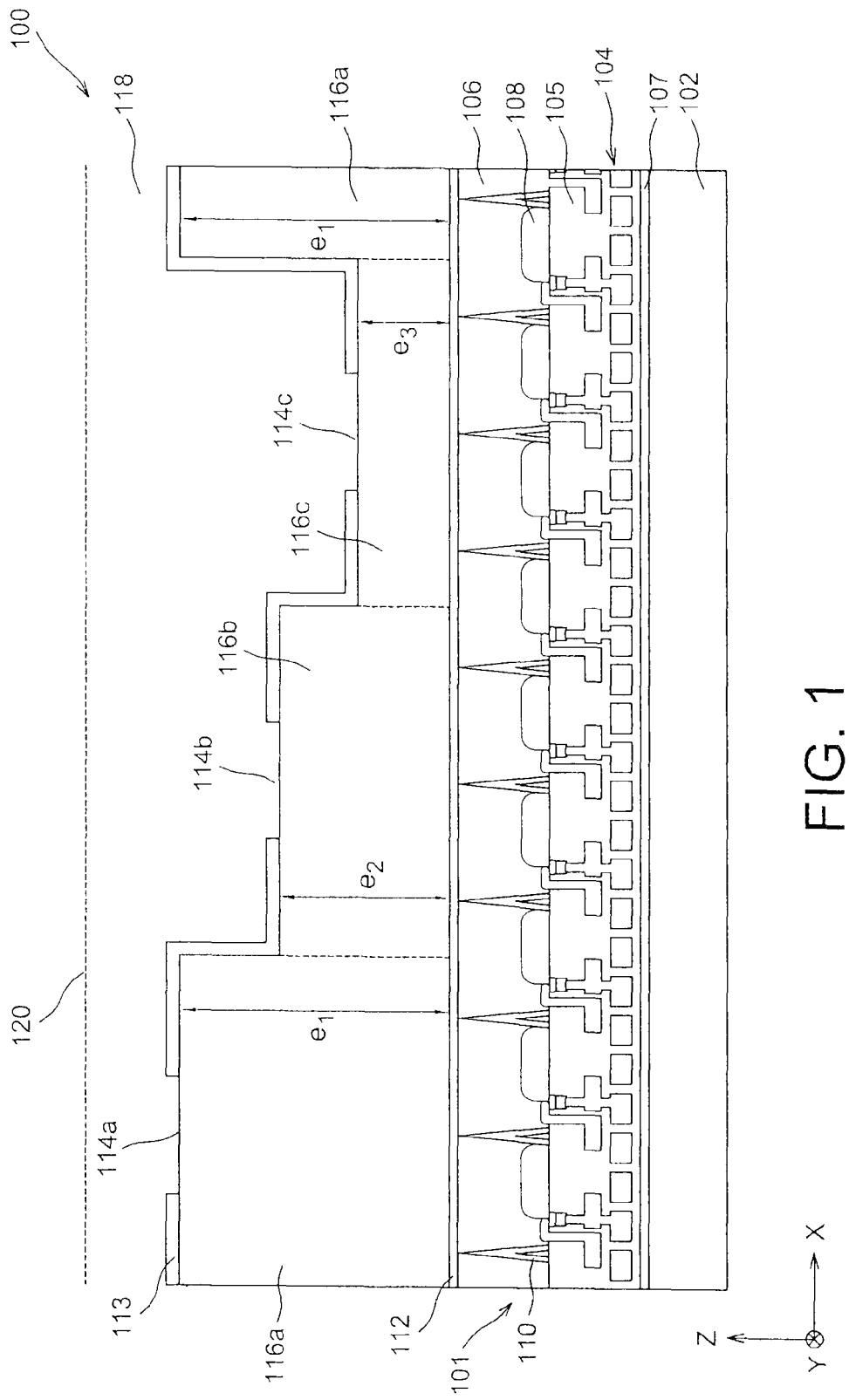
FIGS. 1 and 2 represent an imager device, object of the present invention, according to a first embodiment.
Figure 2:
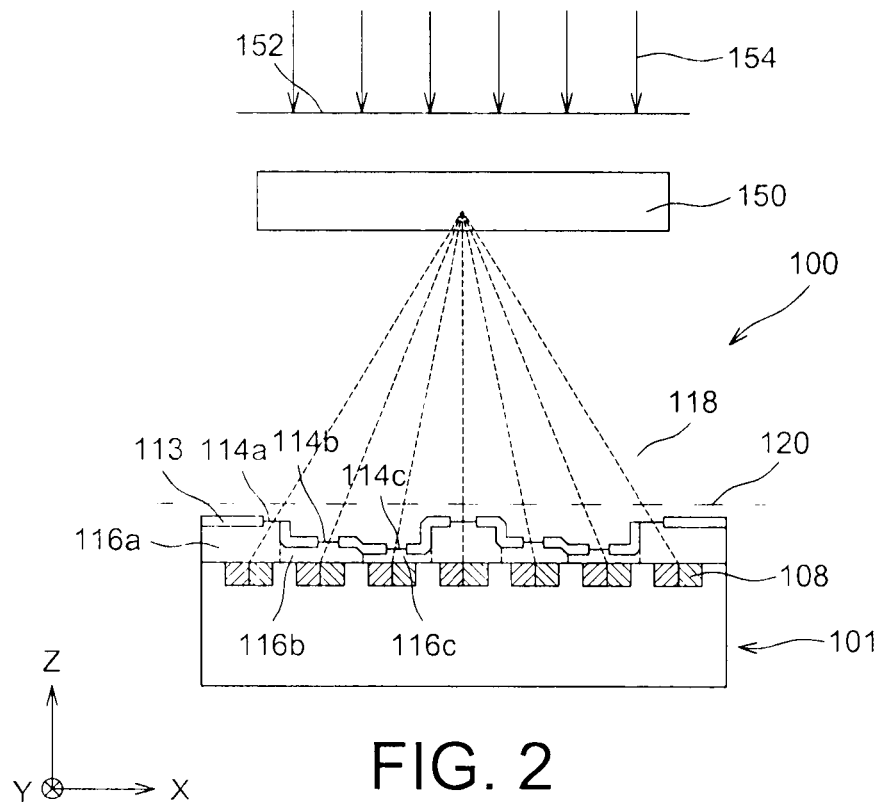

FIGS. 1 and 2 will be first referred to, which schematically represent an imager device 100 according to a first embodiment.

The imager device 100 includes an imager integrated circuit 101 comprising a support 102 on which are provided several levels of electric interconnections lines 104, for example metal-based. The electric interconnection lines 104 are provided in a dielectric layer 105 covering the support 102 and integral with the support 102 through a bonding layer 107. A semi-conductor layer 106 covers the dielectric layer 105. The imager integrated circuit 101 includes a plurality of photodetectors, herein photodiodes including semi-conductor doped areas coupled to MOS transistors, and provided as a square matrix, each photodetector forming a pixel 108 of the imager device 100. The photodetectors form a matrix of pixels 108. The imager integrated circuit also includes portions of material 110 forming separations between the pixels 108, within the semi-conductor layer 106, comprised of, for example, $SiO_2$, and possibly polycrystalline silicon. Finally, the semi-conductor layer 106 is covered with a passivation layer 112.

The imager integrated circuit 101 is herein of the backside type, the light rays entering the imager integrated circuit 101 on its backside face, that is on the side opposite to that where the electric interconnection lines 104 are located. The imager integrated circuit 101 could have a structure different from that represented in FIG. 1, and could be in particular of the "front-side" type, the light rays being intended in that case to enter the imager device on its front side face. Generally, the imager device 100 can include any type of imager integrated circuit comprising a matrix of pixels.

The imager device 100 also includes, above the imager integrated circuit 101, a mask comprising an opaque layer 113, that is a layer formed by a material capable of blocking the incident light rays, for example a metal layer comprising aluminium, wherein multiple apertures 114 arranged at different distances from the photodetectors of the pixels 108 are formed. The mask thereby forms a structure comprising apertures 104 provided on different levels, or at different heights with respect to the matrix of pixels 108. This arrangement in different levels is achieved thanks to portions of optically transparent material 116 having different thicknesses provided between the imager integrated circuit 101 and the opaque layer 113. The imager device 100 includes several first portions 116a of optically transparent material having a thickness $e_1$, several second portions 116b of optically transparent material having a thickness $e_2$ and several third portions 116c of optically transparent material having a thickness $e_3$, with $e_1 > e_2 > e_3$. Each of the portions 116a, 116b, 116c is covered with part of the opaque layer 113 including an aperture 114a, 114b and 114c respectively. The thicknesses $e_1$, $e_2$ and $e_3$ are for example between about 1 μm and 100 μm. It is for example possible to have in a first configuration: $e_1 = 1$ μm; $e_2 = 2$ μm and $e_3 = 3$ μm. In a second configuration, there can be $e_1 = 3$ μm; $e_2 = 15$ μm and $e_3 = 80$ μm.

These portions 116 are made, for example, from a layer (or several layers successively deposited against each other) of optically transparent material which is formed on the passivation layer 112 and structured such that it forms these different portions having different thicknesses. The optically transparent material of these portions 116a, 116b and 116c has a refractive index, or optical index, different from that of a material and/or gas 118 (or more generally a fluid), lying above the opaque layer 113 (air in the example of FIG. 1). The optically transparent material can be selected such that it has the most different optical index possible from the material and/or gas 118. The material or gas 118 can also be vacuum or a material the optical index of which is very close to 1, for example $MgF_2$ or porous $SiO_2$. When a material 118 is provided above the portions 116 of optically transparent material, the device 100 can include a planar upper face in that case.

In view of this difference between the refractive index of the material of the portions 116 and the refractive index of air 118, and since the portions 116 have different thicknesses, these portions 116 of optically transparent material form focusing means for the light rays to the matrix of pixels. The location of focusing points of the portions 116 and the distance between these focusing points and the pixels 108 vary as a function of the thickness of the optically transparent material.

The imager device 100 also includes an optical system 150, represented in FIG. 2, guiding light rays 154 from a scene to the matrix of pixels 108, the light rays 154 entering the imager device 100 by an inlet face 152 of the imager device 100. The optical system 150 corresponds for example to an objective lens comprising one or more lenses. The focal plane 120 of the optical system 150 lies in front of the imager integrated circuit 101, that is between the optical system 150 and the matrix of pixels 108. The optical system 150 forms a standard image, with sharp areas and fuzzy areas, on the imager device 100.

Each portion of optically transparent material 116 covers at least partly a group of at least four pixels 108 of the imager integrated circuit 101, and is for example centred with respect to the centre of the 2×2 matrix formed by these four pixels 108.

Each aperture 114 is also located facing the group of pixels 108 covered with each of the portions of optically transparent material 116. The apertures 114 each have for example a cross-section, in a plane parallel to the inlet face 152 of the imager device 100 (parallel to the plane (X,Y) represented in FIGS. 1 and 2), of a circular or substantially circular shape. The apertures 114 are spaced apart from each other such that each of them is provided, along the axes X and Y, for example every 3 pixels as in FIG. 1 (the centres of two adjacent apertures 114 are separated by a distance along the axis X which is equal or substantially equal to the dimension of several pixels along this axis X (3 pixels in the example of FIG. 1), and are separated by a distance along the axis Y which is equal or substantially equal to the dimension for example of three pixels along this axis Y), each aperture 114 forming a diaphragm with respect to each of said groups of four pixels 108. The number of apertures 114, and thus also the number of portions of optically transparent material 116, can be equal to about N/9 or at most equal to N/4, with N corresponding to the total number of pixels 108 of the imager integrated circuit 101. The apertures 114 each have herein a size (diameter or dimension of a side, depending on the aperture shape) equal or close to the dimension of a side of a pixel. More generally, the apertures 114 each have a side lower than twice the size of a pixel.

The position and the diameter of the apertures 114 above each group of four pixels 108, as well as the dimensions of spaces between this group of pixels 108 depend on the focal length of the optical system 150. In this example previously described in connection with FIG. 2, the apertures 114 provided above the pixels 108 are slightly offset with respect to the centres of groups of four pixels 108 such that each aperture 114 is centred with respect to a straight line going through the optical centre of the optical system 150 and the centre of the group of pixels 108 the aperture of which forms a diaphragm.

Figure 3:
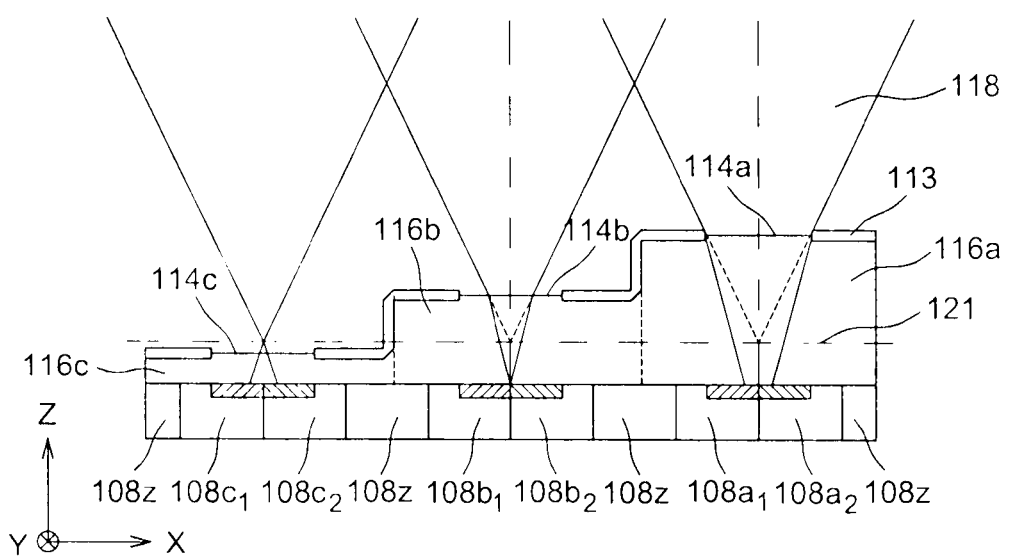
FIG. 3 represents the refraction and focusing occurring in an imager device, object of the present invention, according to the first embodiment.

FIG. 3 represents the refraction occurring in three portions of optically transparent material 116a, 116b, 116c of different thicknesses and provided side by side, and thus the focusing of the light rays performed by these portions of optically transparent material 116a, 116b, 116c. FIG. 3 shows that light coming from three side by side points, from a great distance, away in front of the optical system 150, would converge and focus on a same plane 121 in front of the pixels 108 if there were not the portions of optically transparent material 116 which, by refraction, move the focusing points to different levels, or different heights, that is at different distances from the pixels 108. This movement of the focusing points varies depending on the thickness of the portions 116 and depending on the value of the refractive index of optically transparent material of these portions 116.

Only part of light rays passing through the portions 116 is represented in FIG. 3. Besides, the refraction angle is not a constant for all the rays because they have different inclinations. Crossing a planar dioptre, corresponding to a portion 116, enables a sphericity aberration to be created on an incident spherical wave. The rays closest to the normal of the dioptre are focused at a distance different from those farther from the normal. This aberration is all the greater given that the angular field or even the aperture of the optical system is great. The aberration can be minimized herein, for example, by masking the centre of the optical system. Since the rays of the centre, generally less refracted than those of the edge do not contribute any longer, the aberration is lesser. Moreover, the rays of the optics centre which are thus removed are known to act on the spatial low frequencies of the image (long distance variations in intensity), but not on the spatial high frequencies (edge sharpness). In other words, the global contrast of the image is changed, but not the local contrast, which is rather favourable to the distance measurement by contrast, in particular when a so-called apodizing masking is made, that is introducing a diffraction due to the mask edge without bounces or rings. The apertures 114a, 114b, 114c form means capable of passing, with respect to each of groups of pixels (four pixels in the example described herein) provided facing the apertures 114a, 114b, 114c, the light rays directed towards said group of pixels and passing through the portion of optically transparent material 116a, 116b, 116c covering said group of pixels. The portions of the opaque layer 113 located between the apertures 114a, 114b, 114c enable on the other hand the blocking of the light rays directed towards said group of pixels and passing through other portions of optically transparent material not covering said group of pixels. In the example of FIG. 3, the aperture 114b thus passes rays which pass through the portion of transparent material 116b and which reach the group of four pixels of which both pixels $108b_1$, $108b_2$ are part. The other rays directed towards the group of four pixels of which both pixels $108b_1$, $108b_2$ are part but which would pass through the portions of transparent material different from the portion 116b are blocked by the opaque layer 113. This avoids having interferences between the light rays received by each group of pixels. The same is true for the apertures 114c and 114a which pass rays which pass through the portions of transparent material 116c and 116c respectively, and which reach the groups of four pixels of which the pixels $108c_1$, $108c_2$ and $108a_1$, $108a_2$ are part respectively.

It can be seen in the example in FIG. 3 that the group of four pixels for receiving the light rays through the apertures 114 are for example spaced apart by a distance equivalent to one pixel. The pixel referenced 108z in FIG. 3 are thus not for delivering signals directly used to determine a depth map.

These pixels 108z form, around each group of pixels for capturing light rays, an interval enabling interferences with light rays which are not for being captured by the group of pixels, to be avoided. The width of this interval (equal to one pixel in the example of FIG. 3) is related to the dimensions of the optical aperture of the optical system: the greater the dimensions of this optical aperture, the wider the intervals separating the group of pixels, and conversely (the smaller the dimensions of the optical aperture, the narrower the intervals separating the group of pixels).

The three different distances between the apertures 114a, 114b, 114c and the pixels 108, performing different focusing of the light rays on the pixels, thus have an effect equivalent to an arrangement of group of pixels 108 at three distances different towards the optical system 150 and towards the inlet face 152. In the example of FIG. 3, the inlet interface of the light rays in the portions 116a, 116b, 116c, at the apertures 114a, 114b, 114c, is planar and the optically transparent material of portions 116a, 116b, 116c has a higher refractive index than that of the material or gas 118 located above the opaque layer 113. In this case, the greater the thickness of the portion of optically transparent material 116, the more the pixel 108 is optically close to the convergent optical system 150. Because the portions of optically transparent material 116 enable to move closer or away differently depending on the pixels, it is thereby possible to determine, from the electric signals delivered by the pixels 108 of the imager device 100, the distance of objects the light rays of which are captured by the imager device 100, with respect to the imager device 100 (and in particular with respect to the optical system 150).

There is a substantially constant pitch or distance (the pitch slightly varies with the optical field because of the refraction) between the apertures 114 of a same level, that is between apertures provided on portions of optically transparent material 116 of the same thickness, this pitch being different for each level, and also different from the pitch between groups of pixels 108.

The spacing between groups of pixels (group of four pixels in the above described examples) is selected such that light coming from the whole optical system 150 and passing through one of the apertures 114 can not reach another group of pixels than that located facing this aperture 114.

When portions of the opaque layer 113 mask, between each group of pixels 108, one or more other pixels (referenced 108z in the example of FIG. 3) around said group of pixels, the signals provided by this masked pixels, which can receive rays initially intended for groups of adjacent pixels, can however be used to refine the measurement performed.

The calculations made from the signals delivered by the pixels 108 and enabling the distance from objects to be determined are made assuming the following hypotheses:
the images of objects are at positions of heights different towards the imager device 100 depending on the distance of the objects;
The objects to infinity have a sharp image on the plane passing through the focal length of the optical system 150 (plane 120) and fuzzier and fuzzier image when moving away from this plane 120. On the other hand, the objects closer to the optical system 150 form a sharp image farther, towards the pixels 108, than the focal plane 120 of the optical system 150;
the sharpness in an image is determined from boundaries, or contours, between different elements of the image. The uniform ranges have no sharpness. The sharpness is determined from the contrast of the boundary itself, but also from the contrast in the vicinity of the boundary;
the variation in contrast passes through an extremum (case where the focusing point is located at the pixels) and it is the position of this extremum which enables in particular the distance to be determined.

There are thereby three possible cases for the image captured by the imager device 100:
if the image of a boundary passes through one of the apertures 114 of the opaque layer 113, at least one of the pixels 108 capturing this image delivers a signal having an intensity different from the signals delivered by the other pixels of the group. In this case, the closer the pixels 108 to the sharpness plane of the image, the greater this difference in intensity (equivalent to a strong contrast),
if the image of a boundary passes next to one of the apertures 114 of the opaque layer 113 while being close to this aperture, the pixels 108 of the group located under this aperture will deliver signals having gradually different intensities (equivalent to a fuzzy area). In this case, the closer the pixels to the sharpness plane of the image, the lower the difference between the signals delivered by pixels of the group (equivalent to a low contrast);
in the case of apertures 114 far for any boundaries, no variation in contrast is obtained in the signals delivered by the pixels 108 located facing these apertures 114, the signal delivered by different blocks of four pixels 108 being nearly identical.

The intensity of the signals delivered by the pixels 108 depends on the sharpness, but above all, and mainly, on the image. Thus, by considering one at the time the information delivered by the pixels 108, even arranged at different levels, it is not possible to determine the distance of the object the image of which is captured without other information.

The contrast between neighbouring pixels of a same group of pixels 108 is not enough either in itself to determine the distance of the object the image of which is captured.

Indeed, the contrast passes through an extremum (the case where the focusing point is located at the pixels) and there is thus, for any contrast value different from that extremum, two possible distance values (case where the focusing point is located in front of or behind the pixels).

Besides, the contrast value varies with the height of the aperture 114, that is the thickness of optically transparent material 116 therethrough. This variation is related with the focusing performed by the optical system 150 which concentrates light as a cone. The variation in contrast by switching from one level to another thus corresponds as a first approximation to a conic (for example close to a square hyperbola). This variation type mathematically defines with 2 or 3 parameters. Thus, by making the portions of optically transparent material 116 according to at least three different thicknesses, it is possible to obtain three measurement points of this contrast at different heights, which enables these parameters to be determined and thus the distance of the extremum and therefore the distance between the object and the optical system 150 to be determined.

At each point of the matrix (coordinates X, Y) corresponds a single thickness of optically transparent material 116 (coordinate z of the pixel) in the image plane. It is therefore attempted to obtain, for a boundary, the contrast values at distinct points and to determine by which apertures 114 passes the boundary and/or which apertures 114 are in the vicinity of the boundary. Besides, because each aperture 114 made through the opaque layer 113 passes the rays towards a group of at least four pixels 108, it is therefore possible to determine the gradient of the measured contrast, that is the value with the highest contrast possible between pixels 108, regardless of the orientation of the contrast area with respect to the form and arrangement of pixels 108.

The slope of the gradient gives the maximum contrast value generated by the boundary. The orientation gives the direction perpendicular to the boundary. Thus, in the vicinity of the aperture 114, it is possible to select two other apertures 114 of different heights, but having the same orientation of the contrast, suggesting that this one is dependent on the same boundary.

There are different boundary types in an image:
- the boundary between two colours or the boundary of a shadow on a surface,
- the boundary of an object in front of another one,
- the boundary of an object masked by another one.

Therefore, there are different strategies to determine the true position (X, Y, Z) of the boundaries and then assign through interpolation a depth to the undetermined points (pixels) between its boundaries, to obtain the "depth map" of the captured image, that is the image of the distances of different elements being part of the image.

Figure 4:
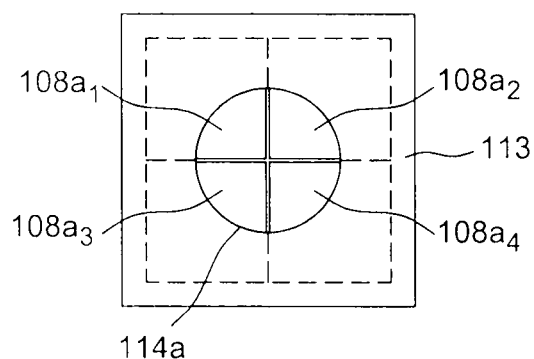
FIG. 4 represents a group of four pixels of an imager device object of the present invention.

It will now be described exemplary calculations performed to determine the distance of an element the image of which is captured. FIG. 4 represents a group of four pixels $108a_1$-$108a_4$, forming the group of four pixels located facing an aperture $114a$ and for receiving light rays passing through this aperture $114a$ and going through a portion $116a$ of optically transparent material covering these four identical pixels $108a_1$-$108a_4$.

Let us assume a, b, c and d to be the electrical signals delivered by the pixels $108a_1$-$108a_4$.

The slope of the contrast gradient is equal to the module $$\sqrt{(a-d)^2+(b-c)^2}.$$

The direction of the gradient corresponds to the phase $$\frac{a-d}{b-c}$$

which is an angle.

The contrast is not only the module, but is also independent of the intensity, and is equal to $$\frac{\sqrt{(a-d)^2+(b-c)^2}}{a+b+c+d}.$$

In order to determine the distance of the captured element, an algorithm is implemented enabling to determine where the boundaries are, an example of which is described herein below. Further algorithms can also be used, for example based on the demosaicing principle of coloured matrices followed by the determination of parameters of the conic function.

From the previous equations, and for all the apertures 114, from the signals of four corresponding photodetectors, several tables of values are obtained: one for the directions of the gradient, and another one for the contrasts (and possibly one for the modules of the gradient and one for the total intensity, used for another algorithm).

Another table is also created defining the accuracy of contrasts (P), towards the noise level of the photodetectors. Several criteria with different weights can be significant. If B is the absolute value of the average noise level of photodetectors and abs( ) designates the absolute value, therefore there is:

$$\left(\frac{abs(a-d)}{2B}+1\right)\left(\frac{abs(b-c)}{2B}+1\right)/4 = P$$

The greater P, the more accurate the contrast is considered. An accuracy P close to 1 could be considered as bad.

Too inaccurate or low contrasts are removed from future calculations for a new table in charge of storing the validity of the position of the aperture 114. In this case, the position is rejected because it is considered to be then part of a homogeneous area, far from a boundary in the image.

Then, for each aperture remaining valid, one or more vicinity areas (for example two areas) are determined. These areas do not necessarily surround the considered aperture, in particular on the edges of the image. The typical dimension of the area will be 5×5 or 6×6 valid apertures 114. To improve the determination accuracy, it is possible to consider several areas, and define a complex shape for them, because a boundary in the image can separate two objects having a different distance, with a contrast of the boundary varying differently on either side of an object edge.

For each vicinity area, the different apertures 114 remaining validated are classified by direction of the gradient relative to the direction of the gradient of the considered aperture 114. The classification criterion therefore is the absolute value in the angular deviation of the gradient to that of the considered aperture 114. From this classification, three apertures 114 with different levels having the smallest angular deviation are retained. The three contrast values of these three apertures 114 are fitted to a "conic" type function to deduce the constant parameters of the function. From these so determined function and parameters, the extremum of the function corresponding to the focusing level of the optical system is extracted. From this extremum position is obtained the distance of the boundary in front of the optics, from optics laws and taking account characteristics of the particular optics used.

The different vicinity areas evaluated around an aperture 114 generally give different distances of the object. The selected area, and therefore the selected distance value, is subjected to a criterion. It is possible to take, for example, as a criterion that the sum of distances of the apertures 114 to the straight line perpendicular to the slope of the contrast of the considered aperture 114 should be minimum. More complex criteria can be selected according to the application.

Finally, the apertures 114 which are not valid for this calculation, because they are without contrast are, according to the needs, left undefined, or theirs distances are calculated by a interpolation method.

The calculations herein performed are operations for gathering table elements, tables for small dimension areas, sorting or comparing or performing basic statistical calculations on small numbers of elements. These operations do not require high computing powers.

In an alternative embodiment, a device including portions 116 having more than three different thicknesses and/or more than four pixels associated with each portion 116 and each aperture 114, can be made.

The distribution of the portions of optically transparent material 116 having different thicknesses is substantially uniformly performed for all the imager device 100. Therefore, it is advantageous to distribute these portions having different thicknesses such that for each portion of optically transparent material 116, the adjacent portions of optically transparent material 116 include thicknesses different from that of said portion of optically transparent material 116.

Figure 5:
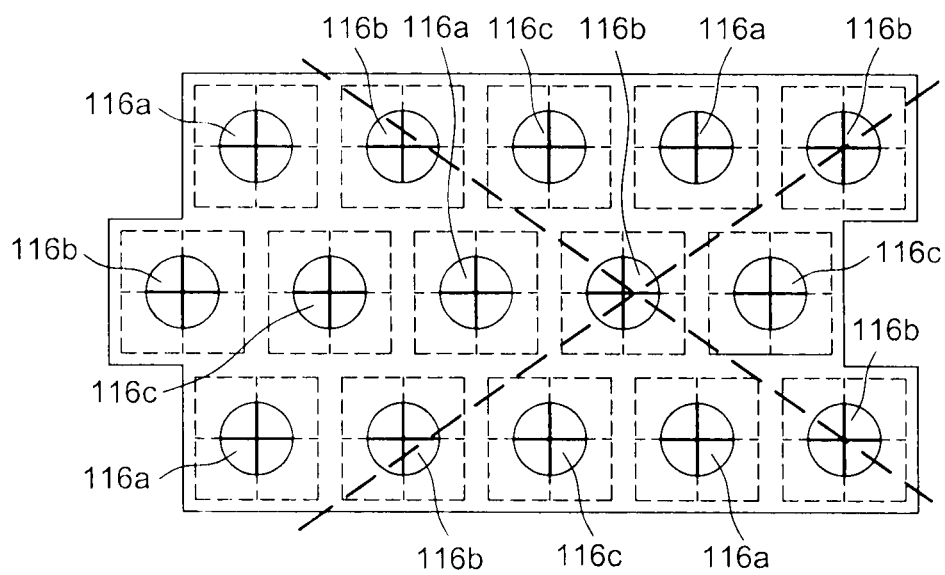
FIGS. 5 and 6 represent examples of distribution of the focusing means in an imager device, object of the present invention.

FIG. 5 represents an exemplary distribution in portions of optically transparent material $116a$, $116b$, $116c$ having different thicknesses. In this example, the portions $116a$, $116b$, $116c$ and thus also the apertures $114a$, $114b$, $114c$, are arranged in a staggered row with respect to each other. Each of these portions 116 (or apertures 114) has six neighbouring portions 116 (or neighbouring apertures 114) distributed by forming a hexagon around it. In the three directions formed by the central portion and adjacent portions, there are actually alternated portions 116 having three different thicknesses $e_1$, $e_2$ and $e_3$, which enable the distances to be determined by calculation according to these directions, from the signals delivered by the pixels 108. On the other hand, along a vertical line or a bisectrix of one of the sides of this hexagon (directions represented by dotted lines in FIG. 5), the portions of optically transparent material 116 which are aligned along these directions have an identical thickness, which prevents the distance along these directions to be determined.

Figure 6:
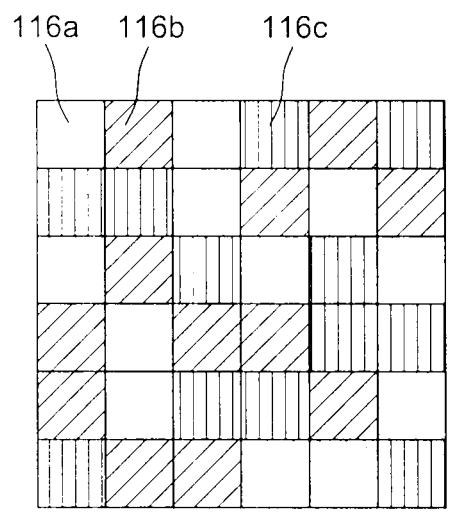

A second exemplary distribution of the portions of optically transparent material 116a, 116b, 116c on the matrix of pixels is represented in FIG. 6. In this FIG. 6, the distribution is schematically represented, the squares with a pattern corresponding to points correspond to portions 116a having the thickness $e_1$, the squares with a pattern corresponding to oblique lines correspond to portions 116b having the thickness $e_2$, and the squares with a pattern corresponding to vertical lines correspond to portions 116c having the thickness $e_3$. This distribution of the portions 116 having different thicknesses is such that if the surface of the matrix of pixels is covered with such an arrangement, a pseudo-random paving is obtained, which is made such that there is no alignment of more than two consecutive portions having a similar thickness, regardless of the direction considered. It can be seen in FIG. 6 that the represented block of 6×6 portions 116 includes a same number of each of the portions 116 having different thicknesses, that is 12 portions 116a, 12 portions 116b and 12 portions 116c. Moreover, depending on this distribution, regardless of the direction of the plane, at least five pixels are required to obtain an alignment of portions of optically transparent material 116 including at least one portion 116 of each of the three thicknesses $e_1$, $e_2$ and $e_3$.

In the above described imager device 100, the apertures 114 are spaced apart by a distance greater than the groups of pixels (the groups of four pixels).

Figure 7:
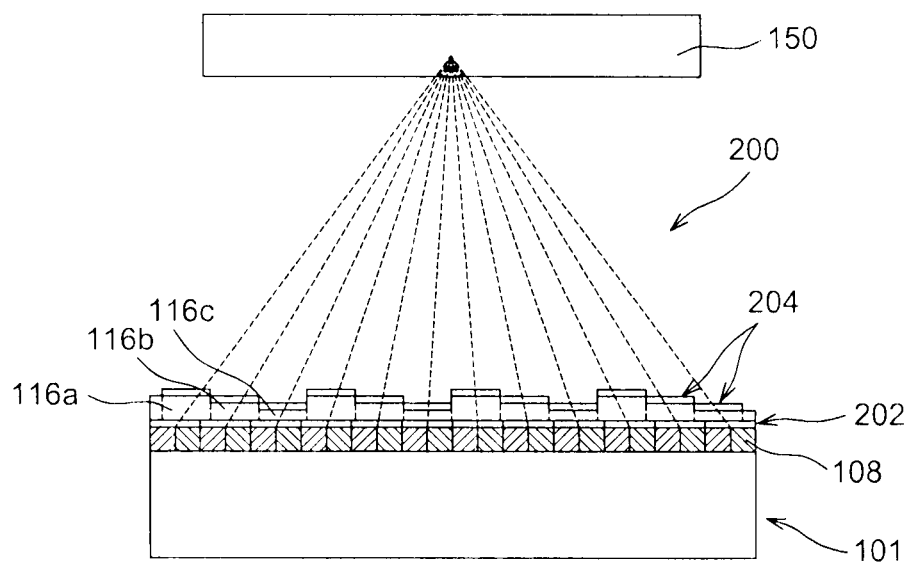
FIG. 7 represents an imager device, object of the present invention, according to a second embodiment.

FIG. 7 which represents an imager device 200 according to a second embodiment is referred to.

As the above description imager device 100, the imager device 200 includes the optical system 150 and the imager integrated circuit 101 comprising in particular the matrix of pixels 108.

The imager device 200 also includes the portions 116 of optically transparent material having different thicknesses covering the groups of four pixels.

The imager device 200 also includes means capable of passing, with respect to each of said groups of pixels 108, the light rays directed towards said group of pixels 108 and passing through the portion of optically transparent material 116 covering said group of pixels 108, and capable of blocking the light rays directed towards said group of pixels 108 and passing through the other portions of optically transparent material 116 not covering said group of pixels 108. However, unlike the imager device 100 wherein these means are formed by the opaque layer 113 and the apertures 114, this means are herein formed by a first matrix of colour filters 202 provided between the matrix of pixels 108 and portions of optically transparent material 116, and a second matrix of colour filters 204 covering the portions of optically transparent material 116, each filter of the first matrix 202 covering one of said groups of pixels 108 and each filter of the second matrix 204 covering one of said portions of optically transparent material 116, the light absorption spectra of two substantially superimposed filters of the first and second matrices being substantially similar.

Two colour filters are considered as substantially superimposed when they are aligned along an axis passing through the optical centre of the optical system 150 and the centre of the group of pixels 108 both filters of which are for filtering the incoming light.

In comparison with the imager device 100, the imager device 200 enables the spacing between the groups of pixels 108 which herein can be adjacent to be suppressed and enables, in the imager device 100, the interferences between light rays captured by the groups of adjacent pixels to be avoided, this function being herein performed by the superimposition of two matrices of colour filters. Indeed, as it is represented in FIG. 7, in the imager device 200, the groups of pixels 108 (groups of four pixels) can be adjoining.

In this second embodiment, the light rays passing through a colour filter of the second matrix 204 only pass through the colour filter of the first matrix 202 covering the group of pixels 108 for receiving these light rays. To do this, the light absorption spectra of these two substantially superimposed colour filters of the first and second matrices are substantially similar. On the other hand, the light absorption spectra of two adjacent colour filters of a same matrix are different. By comparing both imager devices 100 and 200, the colour filters of the second matrix 204 have the same function as the apertures 114, that is they determine the size of the aperture by which the light rays enter, and the colour filters of the first matrix 202 have the masking function performed by the portions of the opaque layer 113.

The colour filters of the matrices 202, 204 are preferably made such that all the colours, for example four, of the colour filters are distributed on the different thicknesses of optically transparent material, because the contrast value is dependent on the colour. The calculation of the distance from the contrast in a same colour corresponds to a same calculation made for obtaining the distance from apertures. Contrasts between different colours imply adjustments to the distance calculation being dependent on the spectrum of the filters.

Figure 8:
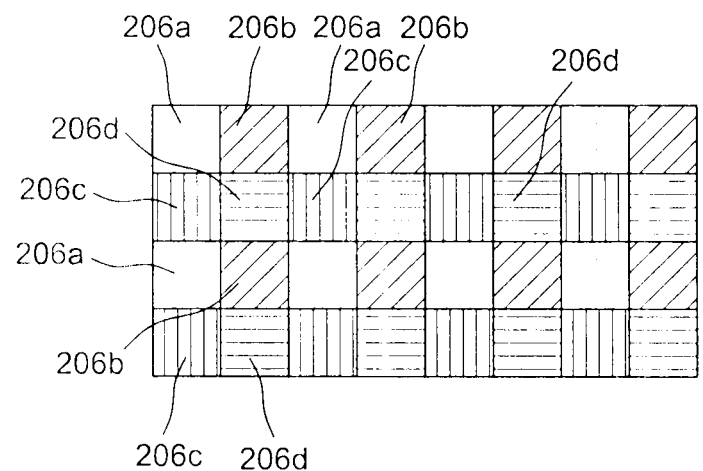
FIG. 8 represents an exemplary matrix of colour filters of the imager device, object of the present invention, according to the second embodiment.

FIG. 8 represents an exemplary embodiment of the matrices of colour filters 202 and 204.

In this example, this matrix is formed by repeating a group of four filters 206a, 206b, 206c, 206d arranged as a square. Thus, the filters 206a, 206b, 206c and 206d correspond to a green or cyan filter, yellow filter, red filter and blue filter respectively. This pattern is repeated on all the plane of the imager device 200, for the second matrix 204 and for the first matrix 202 as well. The colour filters are made such that two adjacent (either horizontally, vertically but also in diagonal) filters are without spectrum coverage, such that light passing through a filter is absorbed by the other surrounding filters. Some spectra of two adjacent filters can be slightly covered by each other (for example the blue and green or cyan filters, or yellow and red filters) whereas others cannot. When the coverage surface between light passing through the filters of the second matrix 204 and arriving on the filters of the first matrix 202 is low, as it is typically the case for filters corners, slight spectrum coverage can be allowed. Thus, the filters 206a and 206d, green or cyan and blue respectively, as well as the filters 206b and 206c, yellow and red respectively, in contact via their corners, have spectra which slightly cover each other. On the other hand, the filters which are adjoining by an edge (two horizontally or vertically side by side filters) will be made such that their spectra are as far as possible from each other, as it is the case in the example of FIG. 8.

In the imager device 200, the four stacked matrices (matrix of pixels 108, first matrix of colour filters 202, second matrix of colour filters 204, matrix of portions of optically transparent material 116) obey different distribution laws. Thus, the pixels 108 are gathered as pairs, whereas the filters are made according to a pattern forming a mask, and the portions of optically transparent material 116 are made according to another pseudo-random pattern to avoid alignments. The repetition pitches of elements of the different matrices can all be different.

In a first alternative embodiment, it is possible to make an imager device coupling the two matrices of colour filters 202, 204 with the opaque layer 113 and the apertures 114a, 114b, 114c in order to better define the apertures and thus better select the light rays received by each group of pixels.

In another alternative embodiment, the imager device can include an imager integrated circuit comprising so-called "front-side" pixels, the light being in this case for entering the side of the face of the imager integrated circuit including electric interconnection line before reaching the pixels. In this case, the pixels are preferably made such that for each group of four pixels, the four photodiodes of these four pixels will be provided under a same aperture in an adjoining manner and the interconnections will be made around all the four photodiodes.

Whatever the embodiment of the imager device, it is possible that it includes microlenses, whether identical or not, provided on the apertures 114 or on the colour filters 204. Because adding these microlenses enables the light rays to be better guided towards the pixels 108, it is possible to reduce the thicknesses of portions of optically transparent material 116 (while having portions with different thicknesses), facilitating the making thereof. Moreover, these microlenses also enable the reflections of light rays to be reduced in the imager integrated circuit.

These microlenses are more curved than the wave from the optical system 150. Because of their strong curvature, these microlenses act as focal length reducers. On the contrary, in the case of a very open optical system 150, the microlenses have a curvature lower than the wave from the optical system 150, thus enabling the light rays to be "straightened up", and act by a focal length elongation. In the latter case, the layers 116 are thicker. The light rays therefore are less oblique, which enables the reflections to be reduced at the different interfaces. It is also possible to use convex microlenses which enable the thicknesses of the layers 116 to be reduced with respect to the concave microlenses.

Figure 9:
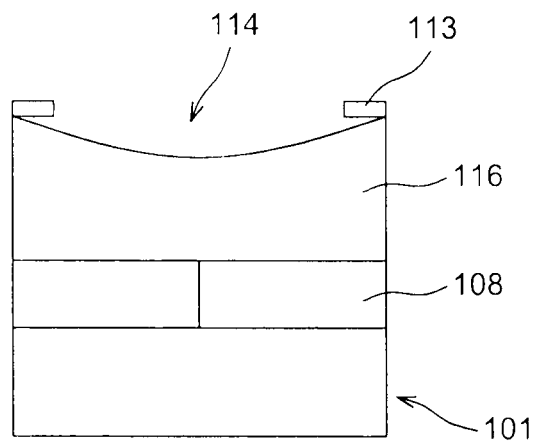
FIG. 9 represents an alternative embodiment of the portions of optically transparent material of an imager device, object of the present invention.

In another alternative, it is possible to make the surfaces of the portions of optically transparent material 116 which are at the apertures 114 such that they form, at each aperture 114, a concave dioptre, enabling the different focal lengths to be better separated by an enhanced refraction. FIG. 9 represents a portion of optically transparent material 116 according to this alternative.

In another alternative, the imager device can include several opaque layers including apertures 114 and/or more than two matrices of superimposed colour filters, which enables the adjustment of levels or signals between the different levels to be improved.

Figure 10:
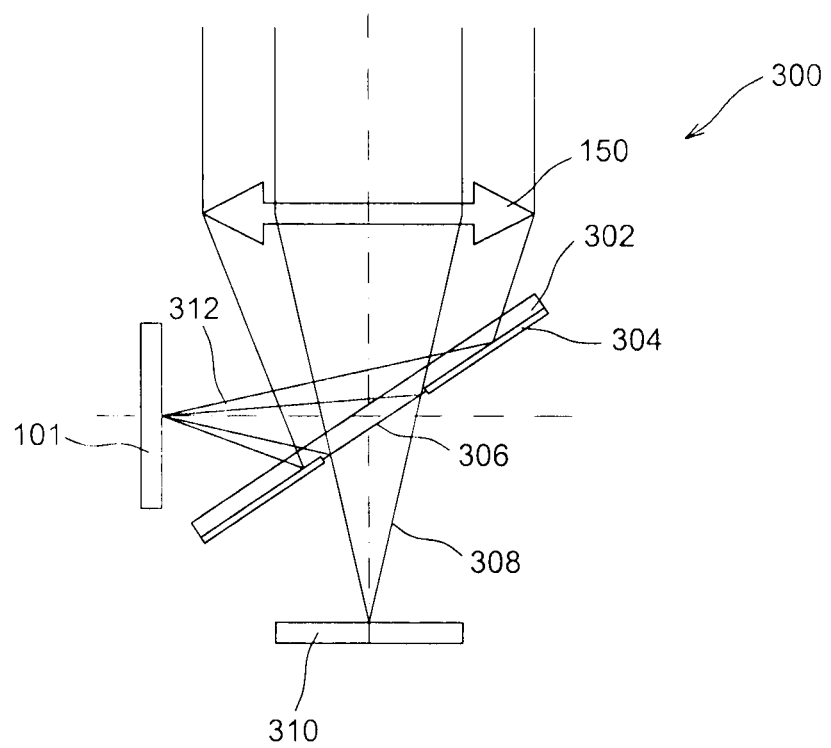
FIG. 10 represents an imager device, object of the present invention, according to a third embodiment.

FIG. 10 which represents an imager device 300 according to a third embodiment is referred to. Unlike the preceding embodiments the light rays from the optical system 150 are not directly sent towards the pixels 108 of the imager device 101. Indeed, in the imager device 300, the light rays from the optical system 150 are sent to a beam splitter 302 coupled to a mirror 304. The mirror 304 includes a central area 306 formed by an aperture, for example an elliptic one, enabling part of the light rays to pass. The light rays from the optical system 150 arrive at the beam splitter 302 and the mirror 304 by forming an angle for example equal to 45° (this angle corresponding to the angle formed between the optical axis of the optical system 150 and the optical axis of the beam splitter 302 and the mirror 304). Thus, the central light rays 308 pass through the beam splitter 302 and the mirror 304 through the central area 306 and reach a conventional imager integrated circuit 310. On the other hand, the peripheral light rays 312 from the optical system 150 are reflected by the mirror 304 and sent to the imager integrated circuit 101 which is coupled, for example, to the portions of optically transparent material 116 and the opaque layer 113 and/or the colour filters 202, 204 such as described above.

Thus are simultaneously obtained a conventional image from the imager integrated circuit 310 and an image enabling the distance of the elements of the captured image to be determined. The beam splitter 302 enables the transmission/reflection coefficient at the border of the elliptic aperture 306 to be gradually changed.

The making of the portions of optically transparent material 116, the opaque layer 113, the apertures 114 or even the colour filters 202, 204 is made during or following the making of the imager integrated circuit 101. The further steps are of the same nature (photolithography deposition, etching) as those implemented for making the imager integrated circuit 101. More particularly, the portions 116 of optically transparent material can be obtained by successive deposition of uniform layers, photolithography and etching of these layers.

Figure 11:
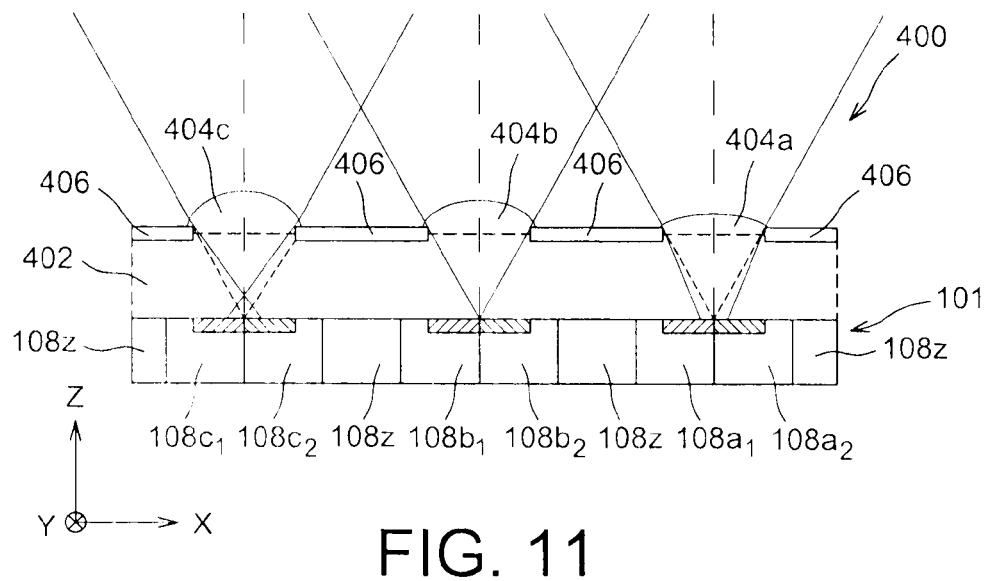
FIGS. 11 and 12 represent an imager device, object of the present invention, according to a fourth embodiment.
Figure 12:
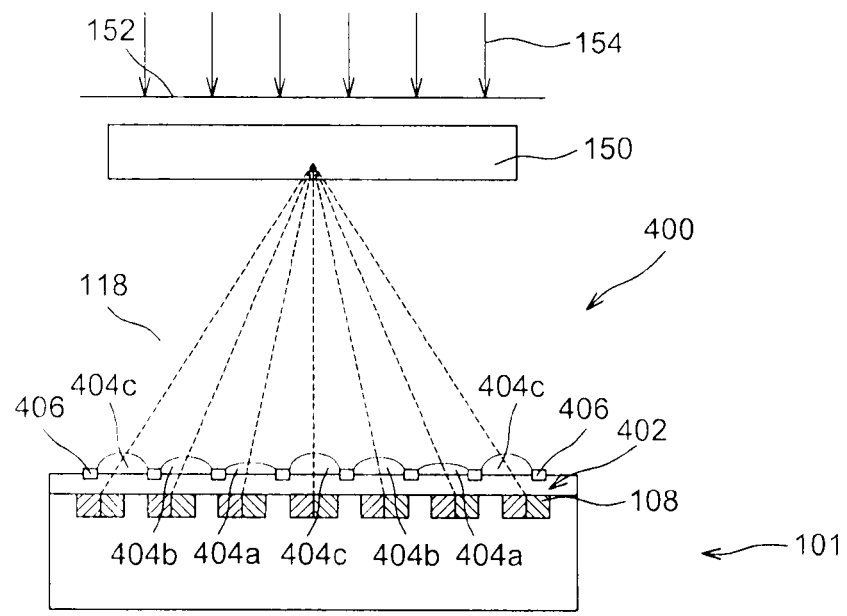

FIGS. 11 and 12 are referred to, which partially and schematically represent an imager device 400 according to a fourth embodiment.

As the above described imager devices, the imager device 400 includes the imager integrated circuit 101 comprising in particular the matrix of pixels 108. The matrix of pixels 108 is covered with a layer 402 of optically transparent material of a substantially uniform thickness.

As the previous imager devices 100, 200 and 300 wherein the portions of optically transparent material 116 provide a focusing function at different levels of the light rays on the pixels, the imager device 400 also includes focusing means enabling the light rays to be focused towards groups of four pixels at different levels, that is providing focusing equivalent to an arrangement of groups of pixels associated with three different distances towards the inlet face for the light rays in the imager device 400. This focusing means correspond to lenses, or microlenses 404 provided on the transparent layer 402. The imager device 400 includes three types of different lenses making different focusing and convergences. In the example of FIG. 11 (wherein only part of the imager device 400 is represented), a first lens 404a provides a focusing of light rays on a first group of four pixels of which the pixels $108a_1$ and $108a_2$ are part. The focusing performed by the first lens 404a is for example equivalent to that performed by the portion of optically transparent material 116a of the imager device 100 represented in FIG. 3. A second lens 404b performs a focusing of light rays on a second group of four pixels of which the pixels $108b_1$ and $108b_2$ are part, and the focusing performed by this second lens 404b is for example equivalent to that performed by the portion of optically transparent material 116b of the imager device 100 of FIG. 3. Finally, a third lens 404c performs a focusing of light rays on a third group of four pixels of which the pixels $108c_1$ and $108c_2$ are part. The focusing performed by the lens 404c is for example equivalent to that performed by the portion of optically transparent material 116c of the imager device 100 represented in FIG. 3.

The thickness of the transparent layer 402 is selected as a function of the desired distance between the lenses 404 and the matrix of pixels 108, as a function of the desired focusing which will be made by the lenses 404 and as a function of the optical index of the materials. The thickness of the transparent layer 402 is for example between about 1 μm and 20 μm, and/or for example between 1 and 4 times the width of a pixel.

It can be seen in FIGS. 11 and 12 that the curvature of the lenses 404c is greater than that of the lenses 404b, which in turn have a greater curvature than that of the lenses 404a. These different curvatures enable different focusing to be obtained between these different types of lenses.

The imager device 400 also includes the optical system 150 (represented on FIG. 12) guiding the light rays 154 from a scene towards the matrix of pixels 108, the light rays 154 entering the imager device 400 by the inlet face 152 of the imager device 400. As in the above described imager devices, an image with sharp areas and fuzzy areas is thus formed on the matrix of pixels 108.

Portions of optically transparent material 406 are provided between the lenses 404. These opaque portions 406 provide the same function as the mask 113 of the imager device 100, that is they enable the light rays which are directed towards one of the groups of pixels 108 but which pass through a lens other than that associated with said group of pixels, to be blocked. The light passing through one of the lenses 404, but which would be poorly focused, thereby could not reach the group of pixels located under a neighbouring lens.

The imager device 400 includes three types of different lenses 404 the vergences of which are different. The differences in vergence between the lenses 404 and the differences between the signals delivered by the pixels of a same group of four pixels enable the contours of objects in the image captured and the distance of objects of the scene to be deduced by calculation, in a single image capture and without using additional external light sources, nor particular modification of the optical system used to guide the light rays to the imager integrated circuit, with respect to a conventional imager device.

As is visible in FIG. 12, the lenses 404 are slightly offset to be centred on the axis connecting the optical centre of the main convergent optical system 150 to the centre of the 2×2 matrix formed by the group of four associated pixels. This axis corresponds to the optical axis of the lens. Photodetectors of pixels of each group of pixels are provided all around the optical axis of the lens associated with the group of pixels. There is a constant pitch between the lenses and this pitch differs from that of groups of four associated pixels. Furthermore, as represented in FIG. 12, all the groups of four pixels have optical axes with a different inclination.

A particular convergence choice for the lenses 404 is such that lenses having a medium curvature (that of lenses 404b in the examples of FIGS. 11 and 12) does not deflect the trajectory of rays from the optical system 150. To do this, these lenses 404b for example correspond to portions of sphere the centres of which are located at the upper face of the matrix of pixels 108, for example at the centres of the groups of associated pixels 108 lying under these lenses. Under these conditions, the lenses 404b have no influence on the focusing of light rays directed towards the corresponding groups of pixels (of which the pixels $108b_1$ and $108b_2$ represented in FIG. 11 are part). Under these conditions, the lenses having a stronger curvature (lenses 404c) more strongly converge the rays and produce a sharp image in front of the pixels 108 (therefore, a fuzzy image will be formed on the pixels 108), and the lenses having a lower curvature (lenses 404a) slightly diverge the rays and move the sharp image behind (or inside) the pixels 108, a fuzzy image being also formed on the pixels 108.

The focusings of three types of lenses 404 are equivalent at three different focus positions of the optical system 150, that is an arrangement of groups of associated pixels at three different distances towards the inlet face for the light rays in the imager device.

The calculations made from the signals delivered by the pixels 108 of the imager device 400 in order to obtain a depth map are similar to those previously made for the previous imager devices 100 to 300. Moreover, the different possible distributions of the pixels above described in connection with FIG. 5, and preferably with FIG. 6, also apply to the imager device 400.

In comparison with the above described imager device 100, use of lenses of different convergences to make the focusing means enables, with respect to the use of portions of optically transparent material having different thicknesses, the necessary space around the groups of pixels to be reduced (that is the dimensions of the opaque portions 406 with respect to the dimensions of the portions of the mask 113 of the imager device 100).

Figure 13:
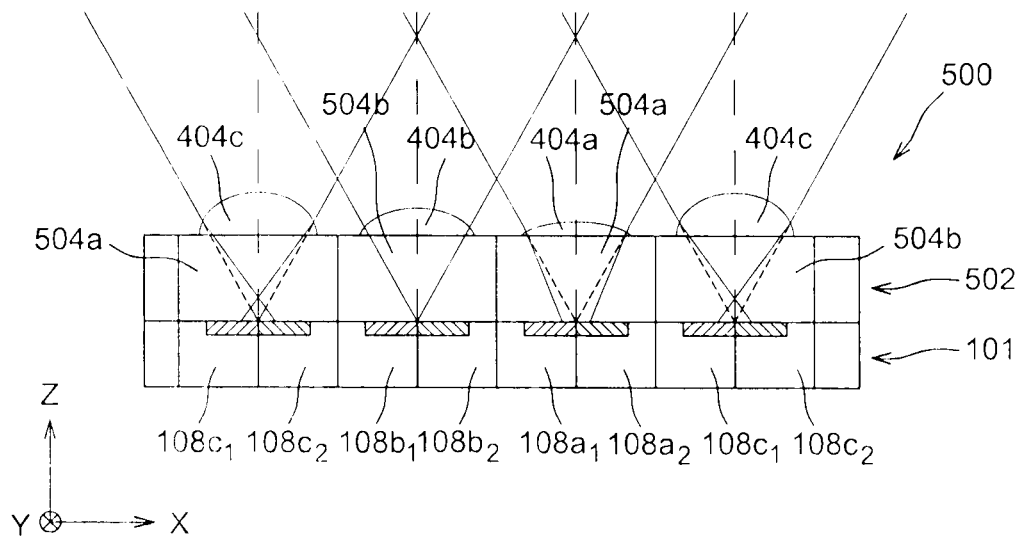
FIGS. 13 and 14 represent an imager device, object of the present invention, according to a fifth and sixth embodiments respectively, Identical, similar or equivalent parts of the different figures described hereinafter have the same reference numerals so as to facilitate passing from one figure to another.

Analogously to the imager device 200, it is possible to use, in instead of the opaque portions 406, optical filters to block or not the light rays directed towards the pixels 108. FIG. 13 partially and schematically represents an imager device 500 according to a fifth embodiment.

As the imager device 400, the imager device 500 includes lenses or microlenses 404 (three different types referenced 404a, 404b and 404c) performing different focusings of the light rays on the matrix of pixels 108.

However, unlike the imager device 400, the imager device 500 does not include portions of opaque material which are provided between the lenses 404. The selection function of the light rays of whether they should reach the group of pixels 108 or not is herein provided by a matrix of colour filters 502 provided between the matrix of pixels 108 and the lenses 404, instead of the transparent layer 402 of the imager device 400. To avoid light rays passing through several colour filters, the light absorption spectra of adjacent colour filters (for example filters 504a and 504b) are selected so that they overlap each other as little as possible.

Unlike the imager device 400, it can be seen that the groups of four pixels are herein disposed side by side in an adjoining manner, without the presence of pixels 108z between the groups of pixels. The resolution of the imager device is thereby improved. In the example of FIG. 13, the matrix of filters 502 only includes filters of two colours (the filters 504a correspond for example to blue colour filters and the filters 504b correspond for example to red colour filters) alternately arranged along a direction (direction parallel to the axis X in the example of FIG. 13). To obtain both a depth map and a colourless image (black and white), it is sufficient to do the same thing in the other direction, that is alternate colours of filters along the direction parallel to the axis Y. The masking effect being obtained is then sufficient. Spaces between the lenses 404 are reduced to the minimum for a better signal, but they can however exist. However, precautions should be taken upon calculating to take account of an influence of the colour on the contrast. The lenses selected for the three contrast signals can be on the same colour. It is also possible to take account of the deviation by applying a correction factor determined beforehand between colours and being possibly a function of the intensity of signals a+b+c+d (signals corresponding to those of the four pixels previously described in connection with FIG. 4).

To perform both a capture of a conventional colour image and a depth map, filters of more than two colours are resorted to. It is preferable that in each colour (the filters of the matrix of colour filters 502 can be distributed in accordance with the example previously described in connection with FIG. 8), the three types of convergences exist, because the contrast value is dependent on the colour. The determination of contrasts in a same colour corresponds to the same calculation as that performed for the imager device 400. The contrasts between different colours can require adjustments dependent on the spectrum of filters, as previously described.

The combined use of the matrix of colour filters 502 and the lenses 404 enables the interaction of light rays between the groups of neighbouring pixels to be reduced, that is the parasitic transmission of light rays from a group of pixels to a group of neighbouring pixels to be reduced.

In an alternative to this fifth embodiment, the imager device 500 could include portions of opaque material, which are analogous to the portions 406 of the imager device 400, provided between the lenses 404, in order to improve the selection of light rays received by the groups of pixels.

Figure 14:
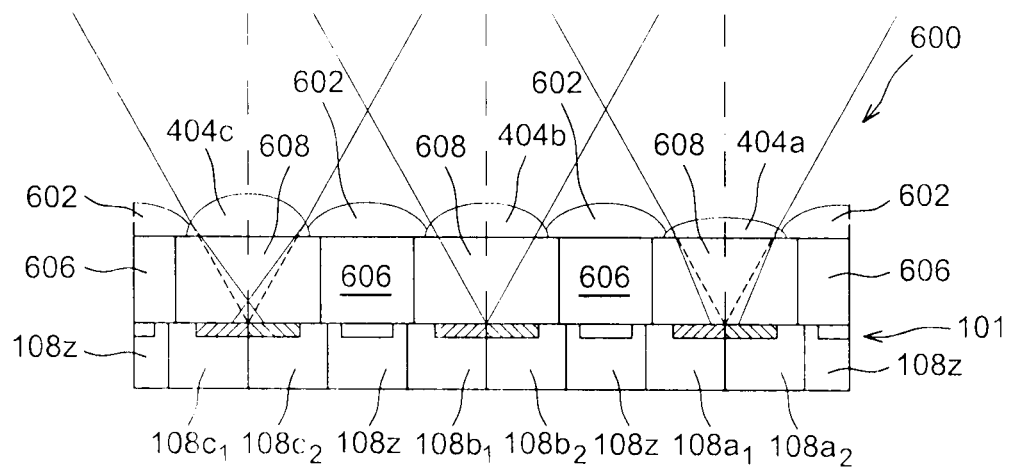

FIG. 14 schematically and partially represents an imager device 600 according to a sixth embodiment. This imager device 600 enables a colour image capture to be made and simultaneously, an image capture enabling a depth map to be calculated.

As for the previously described imager device 400, the imager device 600 includes an integrated circuit 101 comprising in particular a matrix of pixels 108. The imager device 600 also includes the three types of lenses 404a, 404b, 404c provided facing groups of four pixels 108. These groups of pixels (of which the pixels referenced $108a_1$, $108a_2$, $108b_1$, $108b_2$, $108c_1$ and $108c_2$ are part) are spaced apart from each other by the pixels 108z. Lenses 602 cover the pixels 108z for performing the conventional colour image capture. These lenses 602 are for example similar to the lenses 404b, that is they do not deflect the trajectory of rays from the optical system 150 (not represented in FIG. 14). The traditional colour image is thereby obtained from the signals delivered by the pixels 108z. Colour filters 606, for example forming by a Bayer filter, are provided between the lenses 602 and the pixels 108a.

The lenses 404 are provided on filters 608 the light absorption spectrum of which is different from that of the filters 606, only absorbing for example the wavelengths of the infrared or ultraviolet region. A coverage is thus avoided between the light rays passing through the colour filters 606, for the colour image capture, and the filters 608 for filtering the rays which will be captured by the pixels which will deliver electric signals used for calculating the depth map.

The above described imager devices will be advantageously used in the industrial measurement and control appliances, and interactive appliances such as phones and computers resorting to enhanced reality, security appliances in vehicles, for example automotive anticollision systems, or driving aid systems. The imager device could also be used as a complement of photographies and stereoscopic films to allow special effects, or even to form an approach detection system.

The invention claimed is:

1. An imager device including at least:
   one imager integrated circuit comprising a matrix of pixels for receiving light rays from a scene,
   several first, second and third focusing means provided side by side on the matrix of pixels, between the matrix of pixels and an inlet face for the light rays in the imager device, such that each of said focusing means is provided facing a group of at least four said pixels associated with said focusing means and forming a 2×2 matrix, and is capable of focusing part of the light rays to said group of associated pixels, the focusing performed by the first, second and third focusing means being different from one another and equivalent to an arrangement of group of associated pixels at three distances which are different towards the inlet face for the light rays in the imager device,
   fourth means capable of passing, with respect to each group of pixels, the light rays directed towards said group of pixels and passing through the focusing means associated with said group of pixels, and capable of blocking the light rays directed towards said group of pixels and passing through the other focusing means simultaneously to the passing of the light rays directed to said group of pixels through the focusing means associated with said group of pixels, the fourth means avoiding interferences between the light rays received by each group of pixels.

2. The imager device according to claim 1, further including calculating means capable of calculating, from electric signals delivered by the pixels, a distance between the imager device and at least one element of the scene.

3. The imager device according to claim 1, wherein each of the first, second and third focusing means includes a first, a second and a third portions respectively of at least one optically transparent material having non-zero thicknesses $e_1$, $e_2$ and $e_3$ and such that $e_1 > e_2 > e_3$, and wherein the refractive index of the optically transparent material is different from the refractive index of a material and/or a gas present between the inlet face for the light rays and the focusing means.

4. The imager device according to claim 3, wherein, for each of the portions of optically transparent material, at least two of the adjacent portions of optically transparent material include thicknesses which are different from that of said portion of optically transparent material.

5. The imager device according to claim 3, wherein the fourth means include at least one opaque layer covering the portions of optically transparent material and through which passes a plurality of apertures each forming, with respect to each of said group of pixels, a diaphragm.

6. The imager device according to claim 5, wherein each aperture includes, in a plane parallel to the inlet face for the light rays in the imager device, a substantially circular section and/or wherein the centre of each aperture is spaced apart from the centre of a neighbouring aperture by a distance higher than about twice a dimension of a pixel and/or wherein each aperture has dimensions lower than those of one of said group of four pixels and/or wherein each aperture is substantially centred facing a boundary between two adjacent pixels.

7. The imager device according to claim 3, further including an optical system capable of guiding the light rays from the scene to the matrix of pixels.

8. The imager device according to claim 5, further including an optical system capable of guiding the light rays from the scene to the matrix of pixels.

9. The imager device according to claim 8, wherein each aperture is centred with respect to a straight line going through the optical centre of the optical system and the centre of the group of pixels the aperture of which forms a diaphragm.

10. The imager device according to claim 3, wherein the fourth means include a first matrix of colour filters provided between the matrix of pixels and the portions of optically transparent material, and a second matrix of colour filters covering the portions of optically transparent material, each filter of the first matrix covering one of said groups of pixels and each filter of the second matrix covering one said portions of optically transparent material, the light absorption spectra of two substantially superimposed colour filters of the first and the second matrix being substantially similar.

11. The imager device according to claim 10, wherein the first and/or the second matrix of colour filters include first, second, third and fourth colour filters comprising different light absorption spectra.

12. The imager device according to claim 3, wherein at least part of the portions of optically transparent material includes an inlet surface for the light rays forming a concave dioptre.

13. The imager device according to claim 1, wherein each of the first, second and third focusing means includes a first, second and third lenses respectively having different convergences.

14. The imager device according to claim 13, wherein the fourth means include portions of opaque material provided between the lenses.

15. The imager device according to claim 13, further including at least one layer of optically transparent material which is provided between the matrix of pixels and the lenses.

16. The imager device according to claim 13, wherein the first or second or third lenses correspond to portions of spheres the centres of which substantially correspond to the centres of the group of pixels associated with said lenses.

17. The imager device according to claim 13, wherein the fourth means include a matrix of optical filters provided between the matrix of pixels and the lenses, each optical filter of the matrix covering one of said groups of pixels, the light absorption spectra of two adjacent optical filters being different.

18. The imager device according to claim 13, wherein the fourth means include:
first optical filters the light absorption spectra of which cut off the wavelengths in the visible region and pass at least part of the wavelengths of the infrared and/or ultraviolet region, each first optical filter being provided between a lens and the group of pixels associated with said lens,
second optical filters the light absorption spectra of which pass part of the wavelengths of the visible region and cut off the wavelengths of the infrared and ultraviolet region,
the first and second optical filters being alternately provided within a same matrix of optical filters which is provided between the matrix of pixels and the lenses.

19. The imager device according to claim 13, further including an optical system capable of guiding the light rays from the scene to the matrix of pixels.

20. The imager device according to claim 19, wherein each lens is centred with respect to a straight line going through the optical centre of the optical system and the centre of the group of pixels associated with said lens.

21. The imager device according to claim 7, wherein the optical system is coupled to at least one mirror comprising at least one hole such that a first part of the light rays are reflected to said imager integrated circuit by the parts of the mirror which are a peripheral to the hole and a second part of the light rays are guided to another imager integrated circuit through the hole.

22. The imager device according to claim 1, wherein the focusing means are arranged in a staggered row with respect to each other.

23. The imager device according to claim 1, wherein the focusing means are provided as a matrix such that each group of five aligned focusing means include at least one of each of the first, second and third focusing means.

24. The imager device according to claim 1, wherein electric interconnection lines electrically connected to photodetectors of the pixels are provided at the periphery of said group of pixels.

* * * * *

UNITED STATES PATENT AND TRADEMARK OFFICE
CERTIFICATE OF CORRECTION

PATENT NO.       : 8,780,257 B2  
APPLICATION NO.  : 13/443474  
DATED            : July 15, 2014  
INVENTOR(S)      : Pierre Gidon Page 1 of 1

It is certified that error appears in the above-identified patent and that said Letters Patent is hereby corrected as shown below:

On the title page, Item (73), the Assignee's name is incorrect.
Item (73) should read:

-- (73) Assignee: Commissariat à l'énergie atomique et aux énergies alternatives, Paris (FR) --

Signed and Sealed this
Eleventh Day of November, 2014

Michelle K. Lee
*Deputy Director of the United States Patent and Trademark Office*